United States Patent [19]

Horiike et al.

[11] Patent Number: 5,308,791
[45] Date of Patent: May 3, 1994

[54] METHOD AND APPARATUS FOR PROCESSING SURFACE OF SEMICONDUCTOR LAYER

[75] Inventors: Yasuhiro Horiike, 10-7-603, Hikarigaoka, Higashi-ku, Hiroshima-shi, Hiroshima-ken; Kohei Kawamura, Tokyo, both of Japan

[73] Assignees: Tokyo Electron Limited, Tokyo; Yasuhiro Horiike, Hiroshima, Japan

[21] Appl. No.: 848,357

[22] Filed: Mar. 9, 1992

[30] Foreign Application Priority Data

Mar. 25, 1991 [JP] Japan ................................ 3-82984

[51] Int. Cl.⁵ .......................................... H01L 21/306
[52] U.S. Cl. .................................... 437/173; 156/643; 134/1; 437/946
[58] Field of Search .............. 437/946, 173; 134/1; 156/643

[56] References Cited

U.S. PATENT DOCUMENTS 5,024,968  6/1991  Engelsberg ........................ 437/173
5,147,465  9/1992  Maruyama et al. ................. 134/1

Primary Examiner—Olik Chaudhuri
Assistant Examiner—Ourmazd S. Ojan
Attorney, Agent, or Firm—Oblon, Spivak, McClelland, Maier & Neustadt

[57] ABSTRACT

An apparatus for processing the surface of an Si wafer includes a vacuum cleaning chamber in which said Si wafer is housed. He gas is supplied into the cleaning chamber and micro-wave and magnetic field are applied to the He gas to generate excited species which emit vacuum ultraviolet. The vacuum ultraviolet is radiated onto the wafer surface to enable its energy to cut bonds between Si atoms of said wafer and O atoms and forming a natural oxide film on the wafer surface. Ar gas is also supplied into the cleaning chamber to create ions of said Ar gas due to energy added from said excited species. Said ions are supplied onto the wafer surface to form floating potential above said wafer surface. Said ions collide against said wafer surface to eliminate O atoms from said wafer surface. A process chamber is connected to the cleaning chamber through a load lock chamber. Al film is formed on the wafer surface, from which the natural oxide film has been eliminated, in the process chamber.

7 Claims, 2 Drawing Sheets

METHOD AND APPARATUS FOR PROCESSING SURFACE OF SEMICONDUCTOR LAYER

BACKGROUND OF THE INVENTION

1. Field of the Invention

The present invention relates to a method of processing the surface of a semiconductor layer and, more particularly, a method of eliminating natural oxide film, which is formed on the surface of a matter such as a semiconductor wafer, and atoms and/or particles of other matters from the surface of said semiconductor wafer so as to clean the wafer surface. The present invention also relates to an apparatus for carrying out the above method.

2. Description of the Related Art

It is generally said that the natural oxide film ($SiO_2$) formed on the surface of a silicon semiconductor wafer (which will be hereinafter referred to as the wafer) has 20 Angstroms. This natural oxide film is an extremely uneven insulator. When a wiring of aluminium (Al), for example, is formed on the natural oxide film upon manufacturing a semiconductor device, the insulating oxide film disturbs the connection between the wafer and the Al wiring. The semiconductor device thus produced cannot function as expected. In addition, the unevenness of the oxide film disturbs the close adhering of the Al metal relative to the wafer surface. A concrete example of this problem is shown in FIG. 3. A natural oxide film 52 formed on an Si wafer 51 interposes between an Al wiring or pickup electrode 53 and the wafer 51 to make wrong the contact between them. Reference numeral 54 in FIG. 3 denotes an insulating film between layers.

When the oxidized film is present on the base material upon forming a capacitor including a tantalum oxide ($Ta_2O_5$) film thereon, the $Ta_2O_5$ film is reduced to thereby degrade its function as dielectric.

As described above, it has been found that the natural oxide film adds extremely undesired influence to device characteristics. It has been energetically studied, therefore, in various research facilities how to eliminate the natural oxide film from the wafer surface. One of those methods which have been most widely employed these days is to immerse the wafer in a dilute HF solution. A passive film comprising 80% of Si atoms bonded to hydrogen (H) atoms and the remaining thereof bonded to fluorine (F) atoms has been found to be formed on the surface of the wafer which has been immersed in the dilute HF solution. It is therefore believed that the surface of the wafer thus immersed is inactive and effective to refrain the natural oxide film from being formed on the wafer surface.

When a thin film of Al or tungsten (W) is to be formed on the surface of Si layer, the above-mentioned passive film disturbs the formation of this thin film. The reason is that particularly F atoms are so strongly bonded to a part of Si atoms as not to be easily dissociated (bond dissociation energy = 134 kcal/mol). These bonded parts are thus left between the thin film and the Si layer to thereby worsen the close adhering of the thin metal film relative to the Si layer. Or the peeling of the thin metal film off the Si layer is imagined at the worst. The quality of the thin metal film can be thus degraded. Further, when F atoms are attacked and eliminated from the Si layer by OH radicals or oxygen atoms, the above-mentioned bonded parts are oxidized at once as a layer in the horizontal direction. In other words, it has been found that these bonded parts are a key for igniting this so-called oxidization in the horizontal direction.

When Si atoms all over the wafer surface are bonded to H atoms, it is expected that a thin film having extremely fine characteristics can be formed, because Si atoms which have been bonded to H atoms are inactive for oxidization and because H atoms can be relatively easily replaced by other atoms when the thin film is formed. In order to bond Si atoms to H atoms, atoms and/or particles bonded to the surface of the wafer once treated in the dilute HF solution must be eliminated from the wafer surface to clean it.

It is well-known that the wafer surface is heated by infrared ray or irradiated with ray from an Xe lamp in order to eliminate the H/F passive film from the wafer surface. It is also well-known that the wafer surface is washed by pure water after its dilute HF treatment.

In the case of these infrared ray heating and Xe lamp irradiating methods, however, a temperature of about 400° C. is needed for the elimination of H atoms and a temperature of about 900° C. is needed for the elimination of F atoms. The wafer is therefore subjected to thermal degradation and its quality is thus worsened. In the case of the pure water washing method, there is no fear that the wafer is subjected to thermal degradation but contaminants in the pure water cause current to be leaked and the insulating capacity of the wafer to be worsened. In addition, it is difficult to remove the contaminants from the pure water.

SUMMARY OF THE INVENTION

An object of the present invention is therefore to provide a method and an apparatus for processing the surface of the semiconductor layer, said method and apparatus being capable of removing the natural oxide film and other contaminants from the surface of the semiconductor layer without adding almost any damage to it.

Another object of the present invention is t provide a method and an apparatus for processing the surface of the semiconductor layer, said method and apparatus being capable of removing the natural oxide film and other contaminants from the surface of the semiconductor layer by a dry and low temperature process while keeping the wafer in vacuum.

According to a first aspect of the present invention, there can be provided a method of processing that surface of a semiconductor layer on a substrate where atoms of the semiconductor layer are bonded to atoms of contaminants, comprising the steps of: loading the substrate into a first chamber; keeping the first chamber highly reduced in pressure while exhausting it; irradiating the surface of said semiconductor layer with vacuum ultraviolet in the highly-reduced pressure in the first chamber to allow the energy of said ultraviolet to cut bonds between the atoms of the surface of said semiconductor layer and the atoms of the contaminants; and supplying ions of an inactive gas onto the surface of said semiconductor layer while irradiating it with the vacuum ultraviolet, thereby forming floating potential of said ions above the surface of said semiconductor layer and causing said ions to collide against the atoms of said contaminants to eliminate them from the surface of said semiconductor layer.

According to a second aspect of the present invention, there can be provided an apparatus for processing that surface of a semiconductor layer on a substrate where atoms of said semiconductor layer are bonded to atoms of contaminants, comprising: a first chamber in which said substrate is housed; exhaust means for keeping said first chamber highly reduced in pressure while exhausting it; means for supplying a first gas into said first chamber; means for applying micro-wave and magnetic field to said first gas to generate excited species which emit vacuum ultraviolet, said vacuum ultraviolet being radiated onto the surface of said semiconductor layer to cut bonds between the atoms of the surface of said semiconductor layer and the atoms of said contaminants due to energy of said ultraviolet; and means for supplying an inactive gas into said first chamber, said inactive gas being ionized by energy added by said excited species and said ions being supplied to the surface of said semiconductor layer to form floating potential above the surface of said semiconductor layer and collide against the atoms of said contaminants to eliminate them from the surface of said semiconductor layer.

It is preferable in the present invention that the vacuum ultraviolet (having a wavelength of 0.2-200 nm) includes that ultraviolet which is emitted from the excited species created by plasma of helium (H) gas. Only this ultraviolet emitted from the excited species may be used, or both of this ultraviolet and that ultraviolet which is emitted from ultraviolet source located outside may be used. In order to effectively introducing the ultraviolet emitted from outside into the first or cleaning chamber, a ultraviolet-transmission window is attached to a part of the first chamber and the ultraviolet source is located outside the first chamber to radiate the ultraviolet onto the surface of the substrate to be processed in the first chamber through the ultraviolet-transmission window.

It is desirable that the inactive gas ions are created by energy added from the excited species. However, the ionizing of the inactive gas can be achieved by other means. It is preferable that the inactive gas has an ionizing energy smaller than the resonant line (21.2 eV) of He but a larger atomic weight. Argon (Ar), Krypton (Kr) or Xenon (Xe), for example, can be used. The ionizing energy of Ar is 15.7 eV and those of Kr and Xe are smaller than that of Ar.

According to the present invention, atoms and/or particles bonded to the surface of the substrate to be processed can be eliminated therefrom at low temperature without adding any damage to the surface. The surface can be thus cleaned. In addition, the inactive gas can be ionized by light energy added from the excited species. This enables energy to more effectively be used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
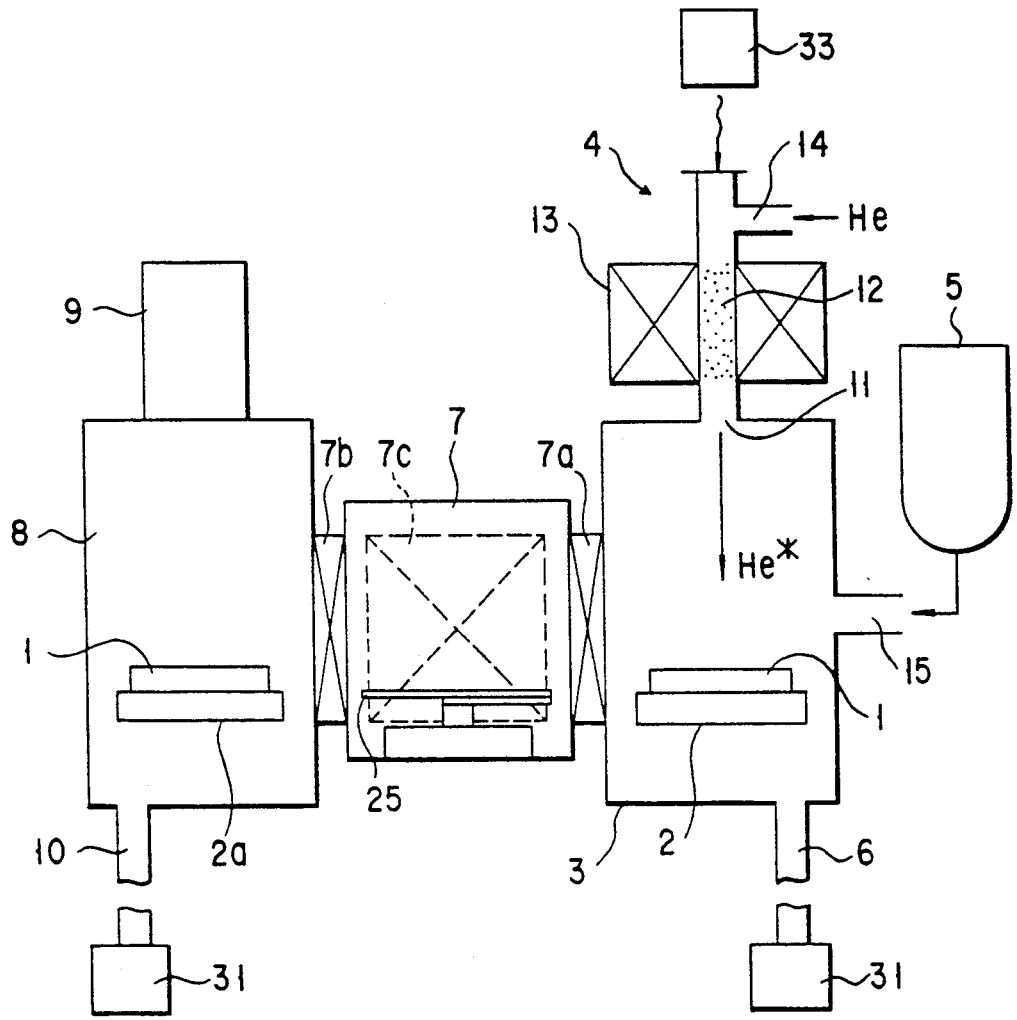
FIG. 1 is a sectional view roughly showing the apparatus for processing the top or surface of the semiconductor layer according to a first embodiment of the present invention.

FIG. 1 shows a first embodiment of the present invention. The processing apparatus according to this embodiment of the present invention includes a cleaning chamber 3 in which an electrostatic chuck 2 for suction-holding a wafer 1 to be processed is housed. Located next to the cleaning chamber 3 is a plasma generator section 4 for applying micro-wave discharge and magnetic field to gas (He) supplied into the cleaning chamber 3 to generate He excited species which emit ultraviolet. Inactive gas such as Ar, Kr or Xe is supplied into the cleaning chamber 3 by an inactive gas supply member 5.

The cleaning chamber 3 has an exhaust pipe 6 connected to a vacuum pump 31. The cleaning chamber 3 can be thus kept vacuum by the vacuum pump 31. Heater coils are embedded in the chuck 2 in order to heat the wafer 1. An infrared lamp may be provided instead of the heater coils. The internal pressure of the cleaning chamber 3 is set $1 \times 10^{-4}$ Torr and the temperature of the wafer in it is set lower than 300° C. A process chamber 8 in which vacuum evaporation is carried out is connected to the cleaning chamber 3 with a load lock chamber 7 interposed between them. The load lock chamber 7 has a gate 7a at its cleaning-chamber-facing side, a gate 7b at its process-chamber-facing side, and a gate 7c at its outside-atmosphere-facing side. A well-known handling member 25 is housed in the load lock chamber 7.

An electrostatic chuck 2a for suction-holding the wafer 1 is housed in the process chamber 8. An electron beam gun 9 for shooting electron beam to a material to be deposited on the wafer 1 is attached to the process chamber 8, facing the wafer 1 held by the electrostatic chuck 2a. The process chamber 8 has an exhaust pipe 10 connected to a vacuum pump 32. The process chamber 8 can be thus held vacuum by the vacuum pump 32, as seen in the cleaning chamber 3.

The plasma generator section 4 has a plasma generating area 12 communicated with an inlet 11 of the cleaning chamber 3 which faces the wafer 1 held by the electrostatic chuck 2a in the cleaning chamber 3. A magnetic coil 13 (875 gauss) encloses the plasma generating area 12 and micro-wave (2.45 GHz) is applied to it by a micro-wave supply member 33. The plasma generating area 12 is thus constructed to create electron cyclone resonance (ECR). He gas supplied into the plasma generating area 12 through an He supply opening 14 is therefore subjected to micro-wave discharge and magnetic field applied at the plasma generator section 4 to generate He excited species.

The inactive gas supply member 5 is a bomb connected to an inactive gas supply opening 15 located adjacent to the side of the wafer 1 in the cleaning chamber 3. This bomb contains inactive gas such as Ar therein.

This processing apparatus according to the first embodiment and arranged as described above will be operated as follows.

The wafer or Si wafer 1 is carried into the load lock chamber 7 through the gate 7c. The pressure in the chamber 7 is adjusted and the wafer 1 is then carried into the cleaning chamber 3 by the handling member 25.

The cleaning chamber 3 is kept as a closed space and its ambient pressure is set $2\times10^{-4}$ Torr and the temperature of the wafer 1 in it is set 300° C.

He gas is then supplied into the plasma generating area 12 through the He supply opening 14. When microwave of 2.45 GHz and magnetic field of 875 gauss are applied to the He gas thus supplied at the plasma generator section 4, He excited species are generated. The He excited species are supplied, as a down stream (or a flow in which ion species are bonded to electrons and changed neutral), into the cleaning chamber 3. And they become stable neutral He while emitting vacuum ultraviolet or light energy equal to 21.2 eV. The light energy or vacuum ultra-violet is radiated on the wafer surface to cut bonds between oxygen atoms and Si atoms forming a oxide film on the wafer surface, and bonds between atoms and/or particles of other contaminants and Si atoms on the wafer surface, while interacting with these atoms and/or particles.

Inactive gas (or Ar gas, for example) supplied together with the He excited species into the cleaning chamber 3 through the inactive gas supply opening 15 is ionized (15.7 eV) by the light energy of the He excited species. Ionized gas atoms collide against the wafer surface while forming floating potential, lower than 10 eV, above the wafer surface. The atoms and/or particles of the contaminants including the natural oxide film on the wafer surface can be thus eliminated by kinetic momentum or energy conversion. The elimination speed of the natural oxide film is 3 Å/min.. The cleaning chamber 3 is exhausted by the pump 31 up to $1\times10^{-6}$ Torr after the above operation.

When the elimination process is finished, the wafer 1 is transferred into the process chamber 8 through the load lock chamber 7. Al is molten by the electron beam gun 9 and deposited on the wafer surface by means of vacuum evaporation ($1\times10^{-7}$ Torr). According to this process of the present invention, therefore, better Al film can be formed on the wafer surface without leaving any natural oxide film between the interface of Al and Si.

Figure 2:
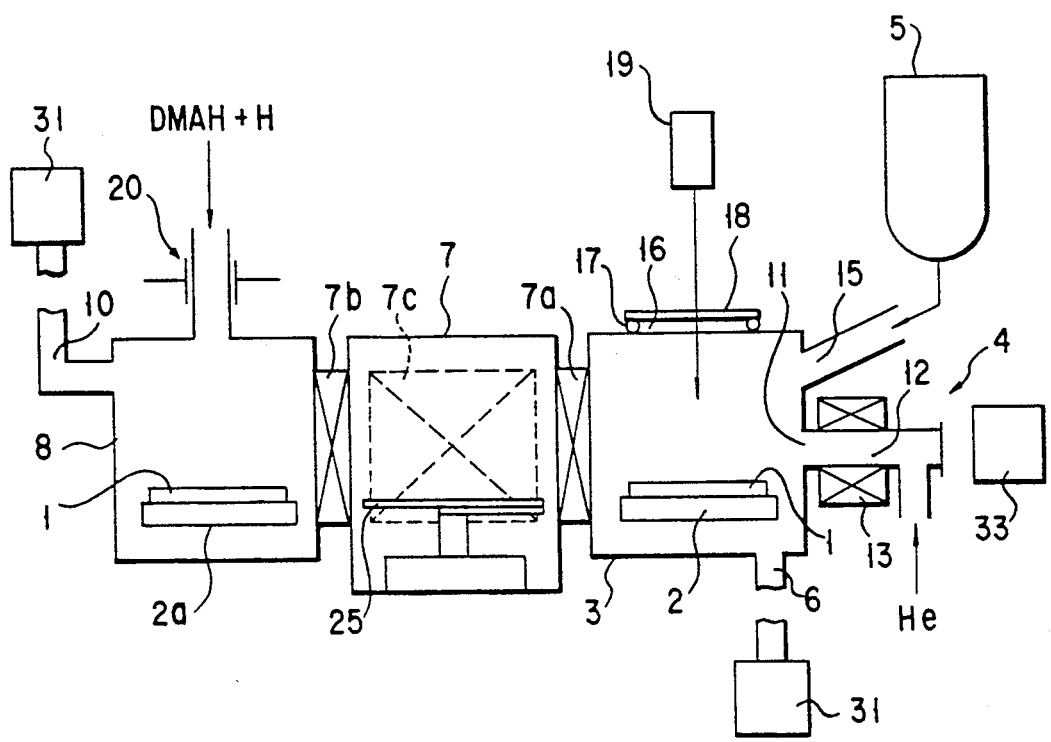
FIG. 2 is a sectional view roughly showing the apparatus for processing the surface of the semiconductor layer according to a second embodiment of the present invention.
Figure 3:
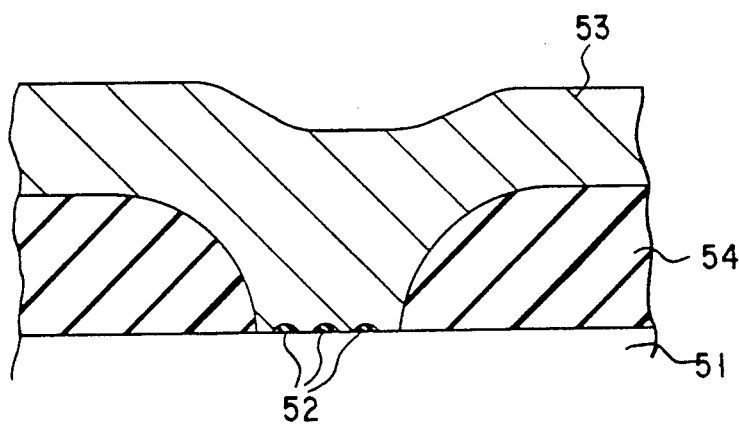
FIG. 3 is a sectional view intended to explain troubles caused by a natural oxide film formed on the wafer.

FIG. 2 shows a second embodiment of the present invention. This processing apparatus is intended to more efficiently eliminate the natural oxide film by irradiating the wafer 1 in the cleaning chamber 3 with ultraviolet from outside in addition to ultraviolet radiated from the He excited species. The same components as those of the processing apparatus according to the first embodiment will be denoted by the same reference numerals and description on these components will be omitted.

That side of the cleaning chamber 3 which is opposed to the wafer 1 held by the electrostatic chuck 2 in the cleaning chamber 3 has an opening 16, to which a ultraviolet-transmission window 18 (made of calcium fluoride ($CaF_2$), magnesium fluoride ($MgF_2$) or ultraviolet-transmission glass) is attached through an O-ring 17. Ultraviolet is radiated from a source 19, such as a mercury lamp or an excimer laser source using ArF or $F_2$, onto the wafer 1 in the cleaning chamber 3 through this ultraviolet-transmission window 18.

In the case of this processing apparatus, mixed gas of dimethyl aluminium hydride $(Al(Ch_3)_2H)+H_2$ is decomposed by micro-wave plasma created by a plasma generator member 20, and the mixed gas thus decomposed is supplied, as a down stream, into the process chamber 8.

The processing apparatus according to the second embodiment and arranged as describe above will be operated as follows.

He gas is supplied into the plasma generating area 12. As seen in the processor apparatus according to the first embodiment, micro-wave discharge and magnetic field are applied to the He gas at the plasma generating area 12 to generate He excited species. At the same time, vacuum ultraviolet is radiated from the ultraviolet emitter 19 onto the wafer 1 in the cleaning chamber 3 through the ultraviolet-transmission window 18. The wafer surface is irradiated, therefore, with vacuum ultraviolet emitted from the He excited species and also with vacuum ultraviolet emitted from the outside ultraviolet emitter 19 to cut bonds between Si atoms and atoms and/or particles of contaminants including a natural oxide film on the wafer 1. Ar gas ($2\times10^{-4}$ Torr) supplied into the cleaning chamber 3 through the inactive gas supply opening 15 is ionized by light energy of the He excited species at the same time. These ions collide against the wafer surface and the atoms and/or particles of the contaminants on the wafer surface are thus eliminated therefrom.

When the elimination process is finished, gates 7a and 7b of the load lock chamber 7 are opened and the wafer 1 is transferred from the cleaning chamber 3 into the process chamber 8. The wafer 1 is heated to a temperature of 300° C. and 1 Torr of mixed gas ($DMAH+H_2$) is supplied into the process chamber 8. DMAH is decomposed by micro-wave plasma (or micro-wave power of 50 W) at the plasma generating area 20 to deposit Al on the wafer surface.

According to this processing apparatus, therefore, the natural oxide film, as well as other contaminants, can be much more easily eliminated and better Al film can be formed without any natural oxide film present between the interface of Al and Si.

Although Ar gas has been used as the inactive gas in the case of the above-described embodiments, Kr or Xe gas can also be used.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of processing that surface of a semi-conductor layer on a substrate where atoms of the semiconductor layer are bonded to atoms of contaminants, comprising the steps of:

loading the substrate into a first chamber;

keeping the first chamber highly reduced in pressure while exhausting it;

irradiating the surface of said semiconductor layer with vacuum ultraviolet in the highly-reduced pressure in the first chamber to allow the energy of said ultraviolet to cut bonds between the atoms of the surface of said semiconductor layer and the atoms of the contaminants; and supplying ions of an inactive gas onto the surface of said semiconductor layer while irradiating it with the vacuum ultraviolet, thereby forming floating potential of said ions above the surface of said semiconductor layer and causing said ions to collide against the atoms of said contaminants to eliminate them from the surface of said semiconductor layer, carrying said substrate from said first chamber into a second chamber through a passage, pressures in said passage and said second chamber being highly reduced, and forming a film on the surface of said semiconductor layer.

2. A method of processing that surface of a semiconductor layer on a substrate where atoms of the semiconductor layer are bonded to atoms of contaminants, comprising the steps of:

loading the substrate into a first chamber;

keeping the first chamber highly reduced in pressure while exhausting it;

irradiating the surface of said semiconductor layer with vacuum ultraviolet in the highly-reduced pressure in the first chamber to allow the energy of said ultraviolet to cut bonds between the atoms of the surface of said semiconductor layer and the atoms of the contaminants; and supplying ions of an inactive gas onto the surface of said semiconductor layer while irradiating it with the vacuum ultraviolet, thereby forming floating potential of said ions above the surface of said semiconductor layer and causing said ions to collide against the atoms of said contaminants to eliminate them from the surface of said semiconductor layer, wherein said vacuum ultraviolet is emitted from excited species derived from plasma of a first gas, which is introduced into said first chamber.

3. The method according to claim 2, further comprising carrying said substrate from said first chamber into a second chamber through a passage, pressures in said passage and second chamber being highly reduced, and forming a film on the surface of said semiconductor layer.

4. The method according to claim 2, wherein said vacuum ultraviolet is radiated from an ultraviolet emitter located outside the first chamber.

5. The method according to claim 2, wherein said ions of said inactive gas are generated by energy added by said excited species.

6. The method according to claim 5, wherein said first gas is He gas.

7. The method according to claim 6, wherein said inactive gas is selected from a group consisting of Ar, Kr and Xe.

* * * * *